(12) United States Patent
Lee et al.

(10) Patent No.: US 11,293,088 B2
(45) Date of Patent: Apr. 5, 2022

(54) CONDUCTIVE STRUCTURE, METHOD FOR MANUFACTURING SAME, AND ELECTRODE COMPRISING CONDUCTIVE STRUCTURE

(71) Applicant: LG CHEM, LTD., Seoul (KR)

(72) Inventors: Ilha Lee, Daejeon (KR); Jin Hyuk Min, Daejeon (KR); Ki-Hwan Kim, Deajeon (KR); Chan Hyoung Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 420 days.

(21) Appl. No.: 15/779,835

(22) PCT Filed: Dec. 7, 2016

(86) PCT No.: PCT/KR2016/014329
§ 371 (c)(1),
(2) Date: May 29, 2018

(87) PCT Pub. No.: WO2017/099476
PCT Pub. Date: Jun. 15, 2017

(65) Prior Publication Data
US 2018/0355467 A1 Dec. 13, 2018

(30) Foreign Application Priority Data
Dec. 7, 2015 (KR) ........................ 10-2015-0173536

(51) Int. Cl.
*C23C 14/04* (2006.01)
*B32B 15/08* (2006.01)
(Continued)

(52) U.S. Cl.
CPC ............ *C23C 14/042* (2013.01); *B32B 15/08* (2013.01); *C23C 14/08* (2013.01); *C23C 14/086* (2013.01);
(Continued)

(58) Field of Classification Search
CPC .. G06F 3/00; G06F 3/041; G06F 2203/04103; B32B 15/08; C23C 14/042;
(Continued)

(56) References Cited

U.S. PATENT DOCUMENTS

2013/0122323 A1* 5/2013 Miki ................. H01L 21/32051
428/632
2013/0140065 A1* 6/2013 Koo ................... H01L 31/02366
174/256

(Continued)

FOREIGN PATENT DOCUMENTS

| CN | 104246913 | 12/2014 |
|---|---|---|
| CN | 104379531 | 2/2015 |

(Continued)

OTHER PUBLICATIONS

Machine Translation of JP 2015-189215 (Year: 2015).*
(Continued)

*Primary Examiner* — Sathavaram I Reddy
(74) *Attorney, Agent, or Firm* — Dentons US LLP

(57) ABSTRACT

The present specification relates to a conductive structure, a method of manufacturing the same, and an electrode including the conductive structure.

13 Claims, 4 Drawing Sheets

(51) Int. Cl.
*G02B 5/00* (2006.01)
*C23C 14/08* (2006.01)
*G06F 3/041* (2006.01)
*C23C 14/20* (2006.01)
*C23C 14/34* (2006.01)
*G02F 1/1343* (2006.01)
*G03F 7/42* (2006.01)
*H01L 51/00* (2006.01)
*H01L 51/52* (2006.01)
*H01L 51/56* (2006.01)

(52) U.S. Cl.
CPC ........ *C23C 14/205* (2013.01); *C23C 14/3464* (2013.01); *G02B 5/00* (2013.01); *G02F 1/13439* (2013.01); *G03F 7/42* (2013.01); *G06F 3/041* (2013.01); *H01L 51/0023* (2013.01); *H01L 51/5215* (2013.01); *H01L 51/56* (2013.01); *G02F 1/134363* (2013.01); *G02F 2201/38* (2013.01); *G06F 2203/04103* (2013.01); *H01L 51/5203* (2013.01); *H01L 2251/558* (2013.01)

(58) Field of Classification Search
CPC ..... C23C 14/08; C23C 14/086; C23C 14/205; C23C 14/3464; G02B 5/00; G02B 5/003; G02F 1/134363; G02F 1/13439; G02F 2201/38; G03F 7/42; H01L 51/0023; H01L 51/5203; H01L 51/5215; H01L 51/56; H01L 2256/558
See application file for complete search history.

(56) References Cited

U.S. PATENT DOCUMENTS

| 2014/0251429 | A1 | 9/2014 | Lim et al. |
| 2015/0158763 | A1 | 6/2015 | Jun |
| 2015/0205326 | A1 | 7/2015 | Lim et al. |
| 2018/0046017 | A1 | 2/2018 | Lee et al. |

FOREIGN PATENT DOCUMENTS

| CN | 104603886 | 5/2015 | |
| CN | 107428127 | 12/2017 | |
| JP | 2015189215 | 11/2015 | |
| KR | 10-2012-0040679 | 4/2012 | |
| KR | 10-1200724 | 11/2012 | |
| KR | 10-1389950 | 4/2014 | |
| KR | 10-2014-0116034 | 10/2014 | |
| WO | WO-2015048828 A1 * | 4/2015 | ........... G06F 3/0443 |

OTHER PUBLICATIONS

Machine Translation of WO 2015/048828A1 (Year: 2015).*
International Search Report and the Written Opinion of PCT/KR2016/014329, dated Mar. 15, 2017.
Office Action of Chinese Patent Office in Appl'n No. 201680069731.9, dated Jul. 30, 2020.

* cited by examiner

CONDUCTIVE STRUCTURE, METHOD FOR MANUFACTURING SAME, AND ELECTRODE COMPRISING CONDUCTIVE STRUCTURE

This application is a National Stage Application of International Application No. PCT/KR2016/014329 filed on Dec. 7, 2016, which claims priority to and the benefit of Korean Patent Application No. 10-2015-0173536 filed in the Korean Intellectual Property Office on Dec. 7, 2015, both of which are incorporated herein in their entirety by reference for all purposes as if fully set forth herein.

TECHNICAL FIELD

The present specification relates to a conductive structure, a method of manufacturing the same, and an electrode including the conductive structure.

BACKGROUND ART

A liquid crystal display is the most important display device recently used in a multimedia society, and is widely used in a mobile phone, a monitor for a computer, a notebook computer, and a television. The liquid crystal display device has a twisted nematic (TN) mode in which a liquid crystal layer including nematic liquid crystals arranged in a twist form is interposed between two sheets of orthogonal polarizing plates, and then an electric field is applied in a vertical direction to a substrate. In the TN mode scheme, the liquid crystals are aligned in the vertical direction to the substrate when the liquid crystal display device displays a black color, so that double refraction is generated by liquid crystal molecules in an oblique viewing angle, and light leaks.

In order to solve the viewing angle problem of the TN mode scheme, an in-plane switching (IPS) mode in which two electrodes are formed on one substrate, and a director of the liquid crystal is adjusted with a lateral electric field generated between the two electrodes is introduced. That is, the liquid crystal display device of the IPS mode scheme is also called an in-plane switching liquid crystal display or a lateral electric field scheme liquid crystal display, and the electrodes are disposed on the same plane within a cell in which the liquid crystals are disposed, so that the liquid crystals are not aligned in a vertical direction, but are aligned to be parallel to a surface in a transverse direction of the electrode.

However, the IPS mode scheme may have a problem in that it is difficult to implement a high image quality by high light reflectance of a pixel electrode and a common electrode.

DETAILED DESCRIPTION OF THE INVENTION

Technical Problem

The present specification provides a conductive structure which is capable of implementing a display having a high image quality.

Technical Solution

An exemplary embodiment of the present specification provides a conductive structure including: a substrate; a metal layer provided on the substrate; and a light reflection reducing layer provided on at least one surface of the metal layer, in which the light reflection reducing layer includes an oxide, a nitride, or an oxynitride of metals including one, or two or more of Al, Mo, Ti, Zr, Y, Si, Ag, Ni, Mn, Nb, Au, Cr and Co; Zn; and Cu.

An exemplary embodiment of the present specification provides a method of manufacturing the conductive structure.

The method includes: preparing a substrate; forming a metal layer on the substrate; and forming a light reflection reducing layer on the metal layer, in which the light reflection reducing layer includes an oxide, a nitride, or an oxynitride of metals including one, or two or more of Al, Mo, Ti, Zr, Y, Si, Ag, Ni, Mn, Nb, Au, Cr and Co; Zn; and Cu.

An exemplary embodiment of the present specification provides an electrode including the conductive structure.

An exemplary embodiment of the present specification provides a display device including the electrode.

Advantageous Effects

The conductive structure according to the exemplary embodiment of the present specification may implement low light reflectance by controlling light reflectance of the metal layer.

The conductive structure according to the exemplary embodiment of the present specification may include a conductive line having a micro line width and low light reflectance, thereby implementing high visibility.

The conductive structure according to the exemplary embodiment of the present specification may minimize a decrease in electric conductivity of the conductive structure according to a process environment when being applied to an electronic device, such as a display device.

Figure 1:
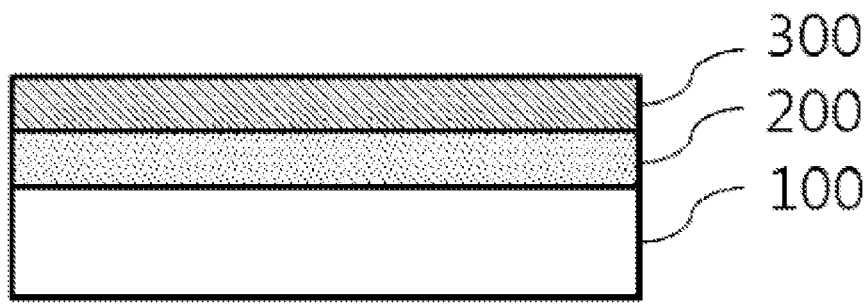
FIGS. 1 to 3 illustrate stack structures of conductive structures according to exemplary embodiments of the present specification.

100: substrate
200: Metal layer
210: Metal pattern layer
300: Light reflection reducing layer
310: Light reflection reducing pattern layer

BEST MODE

In the present specification, when a specific member is positioned "on" another member, this includes a case where another member is present between the two members, as well as a case where the specific member is in contact with another member.

In the present specification, when a specific part "includes" a specific constituent element, unless explicitly described to the contrary, this means the further inclusion of other constituent elements not the exclusion of other constituent elements.

In the present specification, at % is based on 100% of a material configuring a light reflection reducing layer.

Hereinafter, the present specification will be described in more detail.

An exemplary embodiment of the present specification provides a conductive structure including: a substrate; a metal layer provided on the substrate; and a light reflection reducing layer provided on at least one surface of the metal layer, in which the light reflection reducing layer includes an oxide, a nitride, or an oxynitride of metals including one, or two or more among Al, Mo, Ti, Zr, Y, Si, Ag, Ni, Mn, Nb, Au, Cr and Co; Zn; and Cu.

According to the exemplary embodiment of the present specification, the light reflection reducing layer may include an oxide or an oxynitride of metals including one or two of Al, Ni, and Nb; Zn; and Cu.

According to the exemplary embodiment of the present specification, the light reflection reducing layer may include an oxide of metals including one or two of Al, Ni, and Nb; Zn; and Cu.

According to the exemplary embodiment of the present specification, the light reflection reducing layer may essentially include Zn.

According to the exemplary embodiment of the present specification, the light reflection reducing layer may essentially include Zn, and a content of Zn may be 5 at % or more and 30 at % or less, or 15 at % or more and 30 at % or less to the light reflection reducing layer. Particularly, the light reflection reducing layer may essentially include Zn, and a content of Zn may be 20 at % or more and 30 at % or less to the light reflection reducing layer.

According to the exemplary embodiment of the present specification, the light reflection reducing layer may essentially include 0, and a content of O may be 15 at % or more and 50 at % or less, or 25 at % or more and 50 at % or less.

According to the exemplary embodiment of the present specification, the light reflection reducing layer may include Zn with a content of 5 at % or more and 30 at % or less, and may include 0 with a content of 15 at % or more and 55 at % or less.

According to the exemplary embodiment of the present specification, the light reflection reducing layer may include Cu with a content of 1 at % or more and 10 at % or less. Particularly, according to the exemplary embodiment of the present specification, the light reflection reducing layer may include Cu with a content of 5 at % or more and 10 at % or less.

According to the exemplary embodiment of the present specification, the light reflection reducing layer may be consisted of a four component system material in which Zn, Cu, and Al are combined with O, and a content of Zn may be 20 at % or more and 30 at % or less, a content of Cu may be 1 at % or more and 10 at % or less, a content of Al may be 30 at % or more and 40 at % or less, and a content of O may be 25 at % or more and 45 at % or less.

According to the exemplary embodiment of the present specification, the light reflection reducing layer may be consisted of a four component system material in which Zn, Cu, and Al are combined with O, and the light reflection reducing layer may include Zn with a content of 25 at % or more and 30 at % or less.

According to the exemplary embodiment of the present specification, the light reflection reducing layer may be consisted of a four component system material in which Zn, Cu, and Al are combined with O, and the light reflection reducing layer may include Cu with a content of 4 at % or more and 6 at % or less.

According to the exemplary embodiment of the present specification, the light reflection reducing layer may be consisted of a four component system material in which Zn, Cu, and Al are combined with O, and the light reflection reducing layer may include Al with a content of 33 at % or more and 38 at % or less.

According to the exemplary embodiment of the present specification, the light reflection reducing layer may be consisted of a four component system material in which Zn, Cu, and Al are combined with O, and the light reflection reducing layer may include 0 with a content of 25 at % or more and 35 at % or less.

According to the exemplary embodiment of the present specification, the light reflection reducing layer may be consisted of a five component system material in which Zn, Ni, Nb, Cu and O, and a content of Zn may be 20 at % or more and 30 at % or less, a content of Ni may be 20 at % or more and 30 at % or less, a content of Nb may be 5 at % or more and 15 at % or less, a content of Cu may be 1 at % or more and 10 at % or less, and a content of O may be 15 at % or more and 50 at % or less.

According to the exemplary embodiment of the present specification, the light reflection reducing layer may be consisted of a five component system material in which Zn, Ni, Nb, Cu and O, and the light reflection reducing layer may include Zn with a content of 20 at % or more and 25 at % or less.

According to the exemplary embodiment of the present specification, the light reflection reducing layer may be consisted of a five component system material in which Zn, Ni, Nb, Cu and O, and the light reflection reducing layer may include Ni with a content of 23 at % or more and 28 at % or less.

According to the exemplary embodiment of the present specification, the light reflection reducing layer may be consisted of a five component system material in which Zn, Ni, Nb, Cu and O, and the light reflection reducing layer may include Nb with a content of 5 at % or more and 10 at % or less.

According to the exemplary embodiment of the present specification, the light reflection reducing layer may be consisted of a five component system material in which Zn, Ni, Nb, Cu and O, and the light reflection reducing layer may include Cu with a content of 1 at % or more and 5 at % or less.

According to the exemplary embodiment of the present specification, the light reflection reducing layer may be consisted of a five component system material in which Zn, Ni, Nb, and Cu are combined with O, and the light reflection reducing layer may include 0 with a content of 30 at % or more and 40 at % or less.

According to the exemplary embodiment of the present specification, a thickness of the light reflection reducing layer may be 10 nm or more and 100 nm or less. Particularly, according to the exemplary embodiment of the present specification, a thickness of the light reflection reducing layer may be 20 nm or more and 60 nm or less. More particularly, according to the exemplary embodiment of the present specification, a thickness of the light reflection reducing layer may be 30 nm or more and 60 nm or less.

When a thickness of the light reflection reducing layer is less than 10 nm, there may be a problem in that high light reflectance by the first metal layer cannot be sufficiently reduced. Further, when a thickness of the light reflection reducing layer is larger than 100 nm, there may be a problem in that it is difficult to pattern the light reflection reducing layer.

According to the exemplary embodiment of the present specification, with light at a wavelength of 380 nm to 780 nm, an average light reflectance of a surface of the light reflection reducing layer may be 25% or less. Particularly, according to the exemplary embodiment of the present specification, with light at a wavelength of 380 nm to 780 nm, average light reflectance of the surface of the light reflection reducing layer may be 20% or less. More particularly, according to the exemplary embodiment of the present specification, with light at a wavelength of 380 nm to 780 nm, average light reflectance of the surface of the light reflection reducing layer may be 15% or less. According to the exemplary embodiment of the present specification, average light reflectance of the surface of the light reflection reducing layer may be 1% or less.

The average light reflectance may be measured on a surface in which the conductive structure is exposed to a visual field.

According to the exemplary embodiment of the present specification, the light reflection reducing layer may be provided on the surface of the metal layer adjacent to the substrate.

Figure 2:
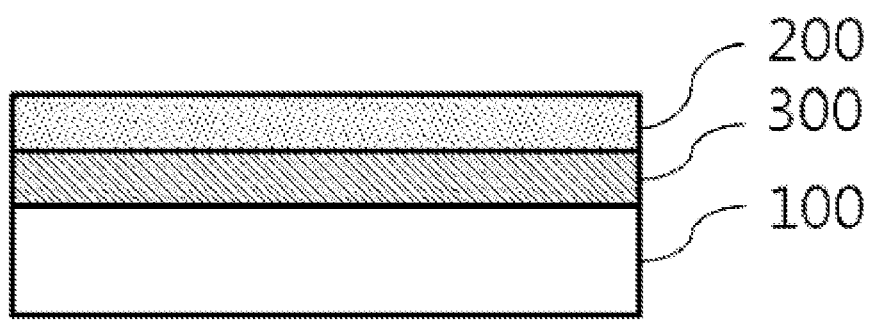

FIG. 2 illustrates a stack structure of a conductive structure according to an exemplary embodiment of the present specification. Particularly, FIG. 2 illustrates the conductive structure in which a substrate 100, a light reflection reducing layer 300, and a metal layer 200 are sequentially provided. However, the conductive structure is not limited to the structure of FIG. 2, and may further include additional layers.

According to the exemplary embodiment of the present specification, the light reflection reducing layer may be provided on a surface opposite to a surface of the metal layer adjacent to the substrate.

FIG. 1 illustrates a stack structure of a conductive structure according to an exemplary embodiment of the present specification. Particularly, FIG. 1 illustrates the conductive structure in which a substrate 100, a metal layer 200, and a light reflection reducing layer 300 are sequentially provided. However, the conductive structure is not limited to the structure of FIG. 1, and may further include additional layers.

According to the exemplary embodiment of the present specification, the light reflection reducing layer may be provided on each of a surface of the metal layer adjacent to the substrate and a surface opposite to the surface of the metal layer adjacent to the substrate.

Figure 3:
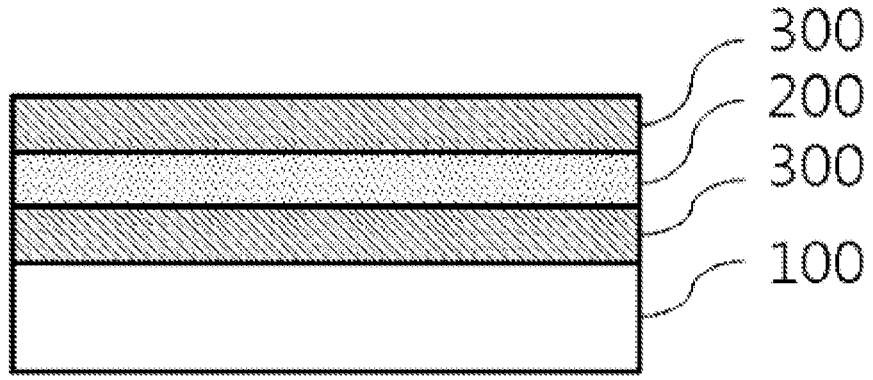

FIG. 3 illustrates a stack structure of a conductive structure according to an exemplary embodiment of the present specification. Particularly, FIG. 3 illustrates the conductive structure in which a substrate 100, a light reflection reducing layer 300, a metal layer 200, and a light reflection reducing layer 300 are sequentially provided. However, the conductive structure is not limited to the structure of FIG. 3, and may further include additional layers.

According to the exemplary embodiment of the present specification, the metal layer and the light reflection reducing layer may include a metal pattern layer including a plurality of openings and a light reflection reducing pattern layer including a plurality of openings, respectively.

According to the exemplary embodiment of the present specification, the metal pattern layer may be formed by patterning the metal layer.

According to the exemplary embodiment of the present specification, the light reflection reducing pattern layer may be formed by patterning the light reflection reducing layer.

According to the exemplary embodiment of the present specification, the metal pattern layer may include the plurality of openings and metal lines dividing the plurality of openings.

According to the exemplary embodiment of the present specification, the light reflection reducing pattern layer may include the plurality of openings and light reflection reducing lines dividing the plurality of openings.

According to the exemplary embodiment of the present specification, the light reflection reducing line may be provided on at least one surface of the metal line.

According to the exemplary embodiment of the present specification, the light reflection reducing pattern layer may be provided on at least one surface of the metal pattern layer. Particularly, the light reflection reducing pattern layer may have the same shape as that of the metal pattern layer. However, each of the metal pattern layer and the light reflection reducing pattern layer does not need to have the completely same line width as a line width of the adjacent pattern layer, and a case where each of the metal pattern layer and the light reflection reducing pattern layer has a smaller or larger line width than a line width of the adjacent pattern layer is included in the scope of the present specification. Particularly, a line width of the light reflection reducing pattern layer may be 80% or more and 120% or less of a line width of the metal pattern layer. More particularly, the light reflection reducing pattern layer may have a pattern form having a line width equal to or larger than a line width of the metal pattern layer.

When the light reflection reducing pattern layer includes the larger line width than the line width of the metal layer, an effect in that the light reflection reducing pattern layer hides the metal pattern layer when a user views may be further exhibited, so that there is an advantage in that an effect by gloss or reflection of the metal layer itself may be efficiently blocked. However, even when the line width of the light reflection reducing pattern layer is the same as the line width of the metal pattern layer, an effect of reducing light reflection may be achieved.

According to the exemplary embodiment of the present specification, the metal pattern layer and the light reflection reducing pattern layer may form a regular pattern or an irregular pattern. Particularly, the metal pattern layer and the light reflection reducing pattern layer may be provided while forming a pattern on the substrate through a patterning process.

Particularly, the pattern may be a polygon, such as a triangle and a quadrangle, a circle, an ellipse, or an amorphous form. The triangle may be a regular triangle or a right-angled triangle, and the quadrangle may be a square, a rectangle, or a trapezoid.

As the regular pattern, a pattern form, such as a mesh pattern, in the art may be used. The irregular pattern is not particularly limited, but may also be a form of boundary lines of figures configuring a Voronoi diagram. According to the exemplary embodiment of the present specification, when the pattern form is the irregular pattern, it is possible to remove a diffracted pattern of reflected light by lighting having directionality by the irregular pattern, and minimize an influence by scattering of light by the light reflection reducing pattern layer, thereby minimizing a problem in visibility.

According to the exemplary embodiment of the present specification, a line width of each of the metal pattern layer and the light reflection reducing pattern layer may be 0.1 μm or more and 100 μm or less.

Particularly, according to the exemplary embodiment of the present specification, a line width of each of the metal pattern layer and the light reflection reducing pattern layer may be 0.1 μm or more and 50 μm or less, may be 0.1 μm or more and 30 μm or less, or may be 0.1 μm or more and 10 μm or less, but is not limited thereto. The line widths of the metal pattern layer and the light reflection reducing pattern layer may be designed according to a final usage of the conductive structure.

When the line width of each of the metal pattern layer and the light reflection reducing pattern layer is less than 0.1 μm, it may be difficult to implement the pattern, and when the line width of each of the metal pattern layer and the light reflection reducing pattern layer is larger than 100 μm, visibility may be degraded.

According to the exemplary embodiment of the present specification, a line gap between adjacent pattern lines of each of the metal pattern layer and the light reflection reducing pattern layer may be 0.1 μm or more and 100 μm or less.

According to the exemplary embodiment of the present specification, the line gap may be 0.1 μm or more, more particularly, may be 10 μm or more, and further more particularly, may be 20 μm or more. Further, according to the exemplary embodiment of the present specification, the line gap may be 100 μm or less, and more particularly, may be 30 μm or less.

According to the exemplary embodiment of the present specification, each of the metal pattern layer and the light reflection reducing pattern layer may be implemented with the pattern of a micro line width, so that an electrode including the metal pattern layer and the light reflection reducing pattern layer may implement excellent visibility.

Figure 4:
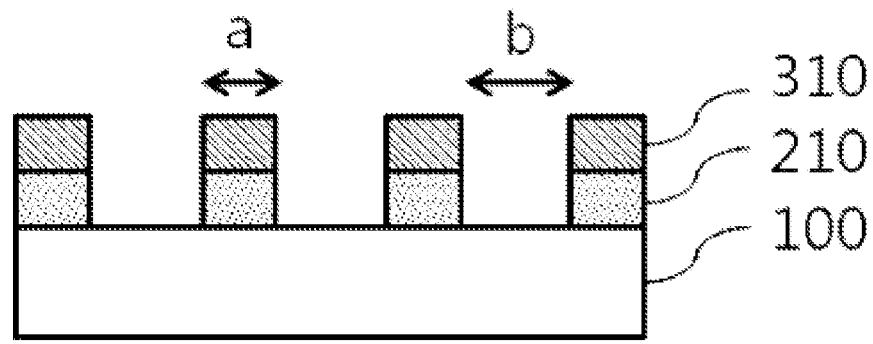
FIG. 4 illustrates a stack structure in a case where the conductive structure is patterned according to the exemplary embodiment of the present specification.

FIG. 4 illustrates a stack structure in a case where the conductive structure is patterned according to the exemplary embodiment of the present specification. Particularly, in FIG. 4, a substrate 100, a metal pattern layer 210, and a light reflection reducing pattern layer 310 are sequentially provided. However, the conductor structure is not limited to the structure of FIG. 4, and may further include additional layers. In FIG. 4, a means line widths of the metal pattern layer and the light reflection reducing pattern layer and b means a line gap between adjacent pattern lines of the metal pattern layer and the light reflection reducing pattern layer.

According to the exemplary embodiment of the present specification, the metal layer may include one or more selected from the group consisting of at least one metal among copper, aluminum, silver, neodymium, molybdenum, nickel, and chrome, an alloy including two or more among the metals, an oxide including one or more among the metals, and a nitride including one or more among the metals. Particularly, according to the exemplary embodiment of the present specification, the metal layer may include aluminum. According to the exemplary embodiment of the present specification, the metal layer may be consisted of aluminum. Further, according to the exemplary embodiment of the present specification, the metal layer may include aluminum as a main component. However, impurities may be partially included according to a manufacturing process.

According to the exemplary embodiment of the present specification, a thickness of the metal layer may be 10 nm or more and 1 μm or less. Particularly, according to the exemplary embodiment of the present specification, a thickness of the metal layer may be 100 nm or more, and more particularly, may be 150 nm or more. Further, according to the exemplary embodiment of the present specification, a thickness of the metal layer may be 500 nm or less, and more particularly, may be 200 nm or less. Electric conductivity of the metal layer depends on a thickness, so that when a thickness of the metal layer is very small, a continuous thickness is not formed, and thus there may be a problem in that a specific resistance value is increased, so that a thickness of the metal layer may be 100 nm or more.

According to the exemplary embodiment of the present specification, the substrate may be a transparent substrate. Particularly, according to the exemplary embodiment of the present specification, the substrate may be glass or polyethylene terephthalate (PET), polycarbonate (PC) or polyamide (PA). Further, according to the exemplary embodiment of the present specification, the substrate may be an insulating layer of a liquid crystal display device. Particularly, the substrate may be a predetermined member on which the metal layer is provided.

According to the exemplary embodiment of the present specification, a transparent conductive layer may be further provided between the substrate and the metal layer.

According to the exemplary embodiment of the present specification, as the transparent conductive layer, the transparent conductive oxide layer may be used. As the transparent conductive oxide, an indium oxide, a zinc oxide, an indium-tin oxide, an indium-zinc oxide, an indium-zinc-tin oxide, an amorphous transparent conductive polymer, and the like may be used, and one, or two or more kinds among them may be used together, but the transparent conductive oxide is not limited thereto. According to the exemplary embodiment of the present specification, the transparent conductive layer may be an indium-tin oxide layer.

According to the exemplary embodiment of the present specification, a thickness of the transparent conductive layer may be 15 nm or more and 20 nm or less, but is not limited thereto. The transparent conductive layer may be formed by using a deposition process or a printing process by using the foregoing material for the transparent conductive layer.

According to the exemplary embodiment of the present specification, a change amount of average light reflectance of the surface of the light reflection reducing layer after five days under an atmosphere of a high temperature and humidity of 85° C. and 85% of relative humidity may be 50% or less.

According to the exemplary embodiment of the present specification, a change amount of average light reflectance of the surface of the light reflection reducing layer after five days under the atmosphere of the high temperature and humidity of 85° C. and 85% of relative humidity may have a negative value. That is, the average light reflectance of the conductive structure may be further decreased after being put under the atmosphere of the high temperature and humidity.

A change amount (%) of the average light reflectance may be calculated by ((average light reflectance after being put under the atmosphere of the high temperature and humidity/initial average light reflectance)−1)×100.

The initial average light reflectance means the average light reflectance of the surface of the light reflection reducing layer before being put under the atmosphere of the high temperature and humidity.

Even though the conductive structure according to the exemplary embodiment of the present specification is put under the atmosphere of the high temperature and humidity, a change in a property of the light reflection reducing layer is not large, so that the light reflection reducing layer may exhibit excellent durability during a manufacturing process of the conductive structure, a distribution of the conductive structure, and a process of applying the conductive structure to an electronic device and using the conductive structure.

According to the exemplary embodiment of the present specification, there is provided a method of manufacturing the conductive structure.

An exemplary embodiment of the present specification provides a method of manufacturing the conductive structure, the method including: preparing a substrate; forming a metal layer on the substrate; and forming a light reflection reducing layer on the metal layer, in which the light reflection reducing layer includes an oxide, a nitride, or an oxynitride of metals including one, or two or more of Al, Mo, Ti, Zr, Y, Si, Ag, Ni, Mn, Nb, Au, Cr and Co; Zn; and Cu.

In the method of manufacturing the conductive structure according to the exemplary embodiment of the present specification, the configurations of the substrate, the metal layer, the light reflection reducing layer, the metal pattern layer, the light reflection reducing pattern layer, and the like are the same as those described above.

According to the exemplary embodiment of the present specification, after the forming of the metal layer, the forming of the light reflection reducing layer may be performed. Otherwise, according to the exemplary embodiment of the present specification, the forming of the metal layer may be performed after the forming of the light reflection reducing layer.

According to the exemplary embodiment of the present specification, the forming of the metal layer may be forming the metal layer on an entire surface of one surface of the substrate.

According to the exemplary embodiment of the present specification, the forming of the light reflection reducing layer may be forming the light reflection reducing layer as an entire layer of one surface of the metal layer.

The entire layer may mean that one physically continued side or film may be formed on an area of 80% or more of one surface of a lower member on which a target member is formed. Particularly, the entire layer may mean one layer before being patterned.

According to the exemplary embodiment of the present specification, each of the forming of the metal layer and the forming of the light reflection reducing layer may use a method of evaporation, sputtering, wet coating, vaporization, electroplating or electroless plating, lamination of metal foil, and the like. Particularly, according to the exemplary embodiment of the present specification, each of the forming of the metal layer and the forming of the light reflection reducing layer may use a method of a deposition or sputtering method.

According to the exemplary embodiment of the present specification, the metal layer may be formed by using a printing method. Particularly, the printing method may use an ink or a paste including metal, and the paste may further include a binder resin, a solvent, a glass frit, and the like in addition to the metal.

According to the exemplary embodiment of the present specification, the forming of the light reflection reducing layer may use a sputter method using one or more kinds of a metal selected from Zn, Cu, Al, Mo, Ti, Zr, Y, Si, Ag, Ni, Mn, Nb, Au, Cr and Co, an oxide of the metal, a nitride of the metal, and an oxynitride of the metal as a sputtering target.

According to the exemplary embodiment of the present specification, the forming of the light reflection reducing layer may use a sputter method using one or more kinds of metal and a metal oxide as a sputtering target.

According to the exemplary embodiment of the present specification, the forming of the light reflection reducing layer may use a co-sputtering method using one or more kinds of a metal selected from Zn, Cu, Al, Mo, Ti, Zr, Y, Si, Ag, Ni, Mn, Nb, Au, Cr and Co, an oxide of the metal, a nitride of the metal, and an oxynitride of the metal as a sputtering target.

According to the exemplary embodiment of the present specification, the forming of the light reflection reducing layer may use a co-sputtering method using one or more kinds of metal and a metal oxide as a sputtering target.

The co-sputtering method is not a reactive process, so that there are advantages in that an appropriate gas fraction does not need to be considered during the deposition and the co-sputtering method may implement the light reflection reducing layer only with DC power.

Further, when the appropriate ingredients of the sputtering target of the metal oxide and the metal are combined, it is possible to decrease the kinds of sputtering target and heterogeneous metals doped in the metal oxide may be adjusted to be applied as the sputtering target.

According to the exemplary embodiment of the present specification, the oxide of the metal, the nitride of the metal, or the oxynitride of the metal may be the material in which heterogeneous metals are doped. Particularly, according to the exemplary embodiment of the present specification, the metal oxide may be selected from the group consisting of ZnO, AZO (Al doped ZnO), $Al_2O_3$, $Cu_2O$, CuO, $SiO_2$, SiO, $ZrO_2$, and $Y_2O_3$.

According to the exemplary embodiment of the present specification, the sputtering target may include one or more kinds of metal selected from Zn, Cu, Al, Mo, Ti, Zr, Y, Si, Ag, Ni, Mn, Nb, Au, Cr and Co, and one or more kinds selected from the group consisting of ZnO, AZO, $Al_2O_3$, $Cu_2O$, CuO, AlN, TiN, $SiO_2$, SiO, $ZrO_2$, and $Y_2O_3$.

According to the exemplary embodiment of the present specification, the forming of the light reflection reducing layer may use the sputter method which uses the metal oxide including Zn, and three or four kinds of metal selected from the group consisting of Cu, Al, Mo, Ti, Zr, Y, Si, Ag, Ni, Mn, Nb, Au, Cr and Co as the sputtering target.

According to the exemplary embodiment of the present specification, the forming of the light reflection reducing layer may use the sputter method which uses AZO and Cu as the sputtering target.

According to the exemplary embodiment of the present specification, the forming of the light reflection reducing layer may use the sputter method which uses ZnO, Cu, Ni, and Nb as the sputtering target.

According to the exemplary embodiment of the present specification, the forming of the light reflection reducing layer may be formed by a deposition process in an oxygen atmosphere, a nitrogen atmosphere, or an oxygen and nitrogen atmosphere.

According to the exemplary embodiment of the present specification, the method may further include forming a metal pattern layer and a light reflection reducing pattern layer by patterning the metal layer and the light reflection reducing layer.

According to the exemplary embodiment of the present specification, in the patterning, the metal layer and the light reflection reducing layer may be simultaneously patterned.

According to the exemplary embodiment of the present specification, the patterning may use a material having an etching resist characteristic. The etching resist may form a resist pattern by using a printing method, a photolithography method, a photography method, a dry film resist method, a wet resist method, a method using a mask, or a laser transfer method, for example, thermal transfer imaging, and particularly, may use the dry film resist method. However, the present invention is not limited thereto. The metal layer and/or the light reflection reducing layer may be etched and patterned by using the etching resist pattern, and the etching resist pattern may be easily removed by a strip process.

According to the exemplary embodiment of the present specification, in the patterning, the metal layer and the light reflection reducing layer may be etched in a lump by using an etchant.

In the method of manufacturing according to the exemplary embodiment of the present specification, when the metal layer and the light reflection reducing layer include the same kinds of metal, the metal layer and the light reflection reducing layer may be etched by using the same etchant, so that there is also an advantage in that the metal layer and the light reflection reducing layer may be etched in a lump.

An exemplary embodiment of the present specification provides an electrode including the conductive structure.

According to the exemplary embodiment of the present specification, the electrode may be an electrode for a touch panel, an electrode for a liquid crystal display, or an electrode for an organic light emitting diode (OLED) display.

An exemplary embodiment of the present specification provides a display device including an electrode.

In the present specification, the display device collectively refers to a monitor for a TV or a computer, and the like, and includes a display device forming an image and a case supporting the display device.

According to the exemplary embodiment of the present specification, the electrode may be an electrode for a touch sensor of a touch screen panel.

According to the exemplary embodiment of the present specification, the electrode may be a wiring electrode, a common electrode, and/or a pixel electrode of a liquid crystal display device. Particularly, the electrode may be a wiring electrode, a common electrode, and/or a pixel electrode in an in-plane switching (IPS) liquid crystal display device.

According to the exemplary embodiment of the present specification, the electrode may be a wiring electrode, a common electrode, and/or a pixel electrode of an OLED display device.

According to the exemplary embodiment of the present specification, the electrode may be a pixel electrode of an OLED lighting device.

Hereinafter, the present specification will be described in detail with reference to Examples. However, Examples according to the present specification may be modified to various other forms, and it is not construed that the scope of the present specification is limited to the Examples described below. The Examples of the present specification are provided for more fully explaining the present specification to those having average knowledge in the art.

MODE FOR CARRYING OUT THE INVENTION

Example 1

A PET substrate was loaded to a sputtering chamber and then vacuum of about $3 \times 10^{-6}$ Torr was maintained. Then, a metal layer having a thickness of about 100 nm was formed by using DC power to an Al sputtering target. A light reflection reducing layer was formed by co-sputtering a Cu sputtering target and an AZO (Al doped ZnO) sputtering target on the metal layer. The Cu sputtering target and the AZO (Al doped ZnO) sputtering target implemented the light reflection reducing layer having a thickness of about nm by adjusting each power by using the DC power. Example 1 is for investigating performance of a conductive structure, and a patterning process was omitted.

Figure 5:
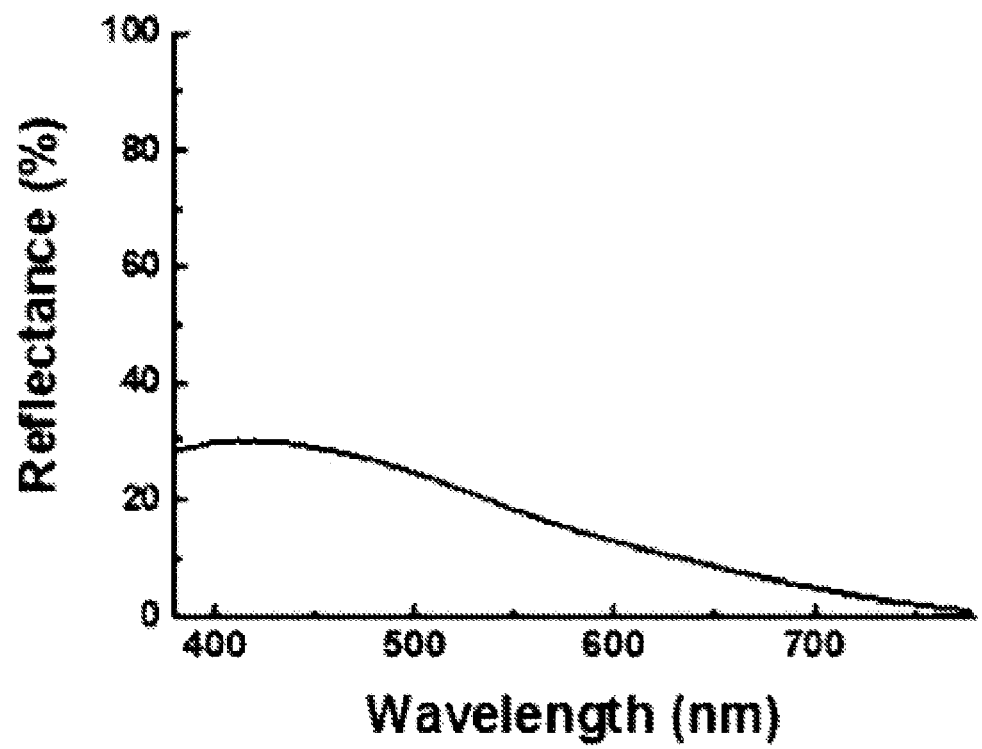
FIG. 5 illustrates light reflectance of a surface of a light reflection reducing layer in a conductive structure according to Example 1.

FIG. 5 illustrates light reflectance of a surface of the light reflection reducing layer in the conductive structure according to Example 1.

Further, Table 1 below represents an element content (at %) of the light reflection reducing layer.

TABLE 1

| Element | Element content (at %) |
|---------|------------------------|
| Al      | 34.6                   |
| O       | 30.7                   |
| Zn      | 28.7                   |
| Cu      | 6                      |
| Total   | 100                    |

Example 2

A PET substrate was loaded to a sputtering chamber and then vacuum of about $3 \times 10^{-6}$ Torr was maintained. Then, a metal layer having a thickness of about 100 nm was formed by using DC power to an Al sputtering target. A light reflection reducing layer was formed by using a sputtering process which uses a sputtering target including Cu, Nb, and Ni and a ZnO sputtering target on the metal layer by using DC power. Example 2 is for investigating performance of a conductive structure, and a patterning process was omitted.

An element contents (at %) of the light reflection reducing layer of a conductive structure manufactured according to Example 2 is represented in Table 2 below.

TABLE 2

| Element | Element content (at %) |
|---------|------------------------|
| Zn      | 24.8                   |
| Ni      | 25.5                   |
| O       | 37.7                   |
| Nb      | 9.1                    |
| Cu      | 2.9                    |
| Total   | 100                    |

In the conductive structure manufactured according to Example 1, with light at a wavelength of 380 nm to 780 nm, an average light reflectance of a surface of the light reflection reducing layer was 11.1%.

Comparative Example 1

A metal layer having a thickness of about 80 nm was formed by using a Cu sputtering target on a PET substrate. A copper-oxynitride material layer having a thickness of about 40 nm was formed by a reactive sputtering process by injecting oxygen gas and nitrogen gas onto the metal layer.

In the conductive structure manufactured according to Comparative Example 1, with light at a wavelength of 380 nm to 780 nm, an average light reflectance of a surface of the light reflection reducing layer was 17.2%.

Comparative Example 2

A metal layer having a thickness of about 150 nm was formed by using a Cu sputtering target on a PET substrate. A light reflection reducing layer was formed by injecting oxygen gas onto the metal layer and co-sputtering a Cu sputtering target and an NiCr sputtering target by using DC power. The Cu sputtering target and the NiCr sputtering target implemented the light reflection reducing layer having a thickness of about 50 nm by adjusting each power by using the DC power.

An element contents (at %) of the light reflection reducing layer of a conductive structure manufactured according to Comparative Example 2 is represented in Table 3 below.

TABLE 3

| Element | Element content (at %) |
|---|---|
| O | 40.8 |
| Ni | 12.8 |
| Cu | 44.3 |
| Cr | 2.1 |
| Total | 100 |

In the conductive structure manufactured according to Comparative Example 2, with light at a wavelength of 380 nm to 780 nm, an average light reflectance of a surface of the light reflection reducing layer was 15.7%.

Experimental Example 1—Constant Temperature and Humidity Test

States of the conductive structures manufactured according to Example 2, Comparative Example 1, and Comparative Example 2 after five days in a high temperature and humidity atmosphere of 85° C. and 85% of relative humidity were measured.

Figure 6:
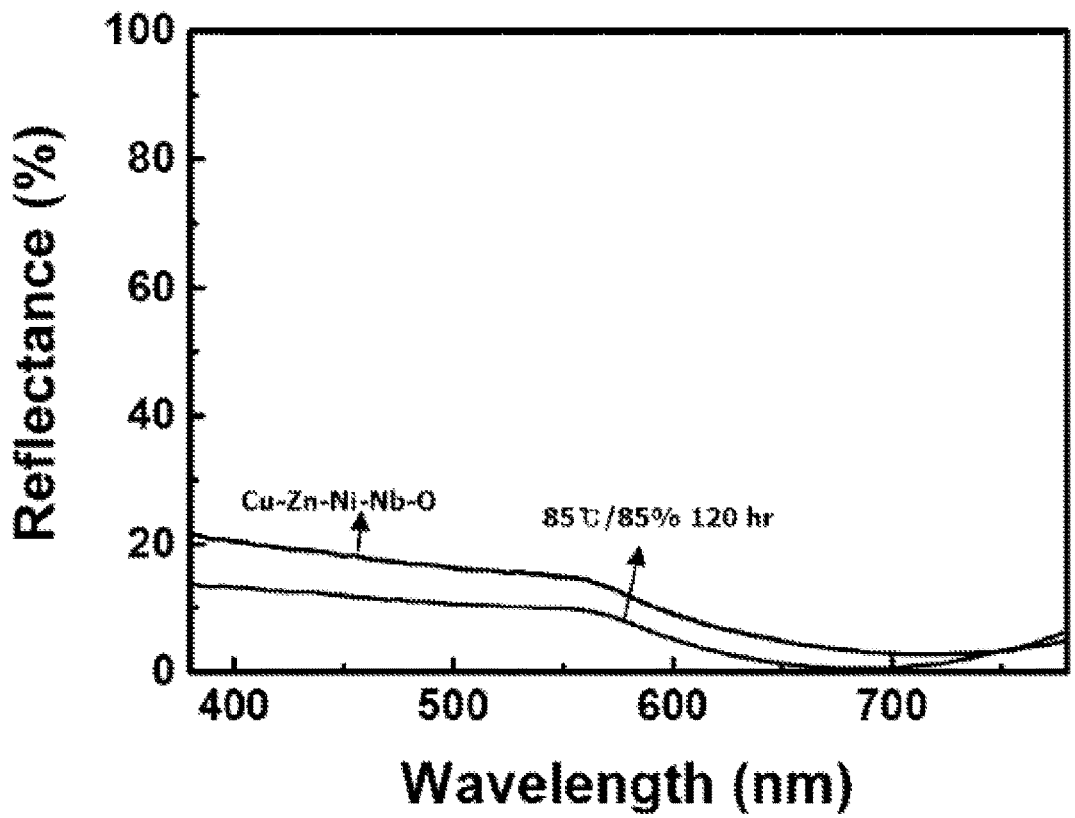
FIG. 6 illustrates a change in light reflectance of a conductive structure according to Example 2 before and after a constant temperature-humidity test according to Experimental Example 1.

FIG. 6 illustrates a change in light reflectance of the conductive structure according to Example 2 before and after the constant temperature-humidity test according to Experimental Example 1. Particularly, as a result of the constant temperature and humidity test of the conductive structure according to Example 2, a change amount of average light reflectance of a surface of the light reflection reducing layer was 37%. In this case, it was confirmed that the average light reflectance of the conductive structure according to Example 2 is rather decreased from 11.1% to 7% in comparison with the average light reflectance before the test.

Figure 7:
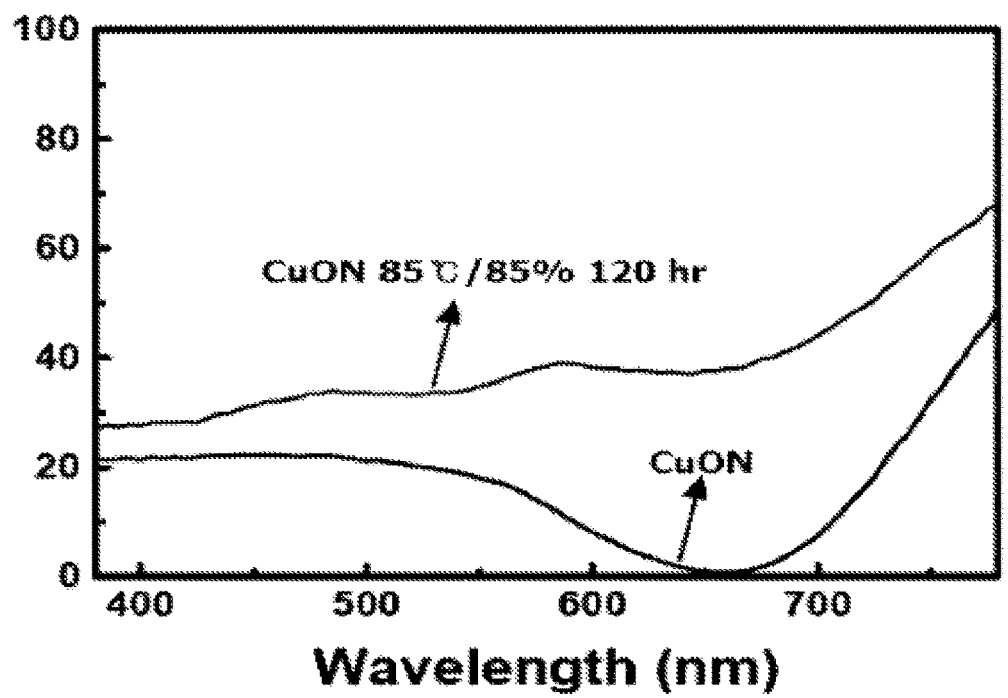
FIG. 7 illustrates a change in light reflectance of a conductive structure according to Comparative Example 1 before and after a constant temperature-humidity test according to Experimental Example 1.

FIG. 7 illustrates a change in light reflectance of the conductive structure according to Comparative Example 1 before and after the constant temperature-humidity test according to Experimental Example 1. Particularly, as a result of the constant temperature and humidity test of the conductive structure according to Comparative Example 1, a change amount of an average light reflectance of a surface of the light reflection reducing layer was 126%. In this case, light reflectance of the conductive structure according to Comparative Example 1 is considerably increased from 17.2% to 39% in comparison with the light reflectance before the test, so that it was confirmed the result that visibility is degraded.

Figure 8:
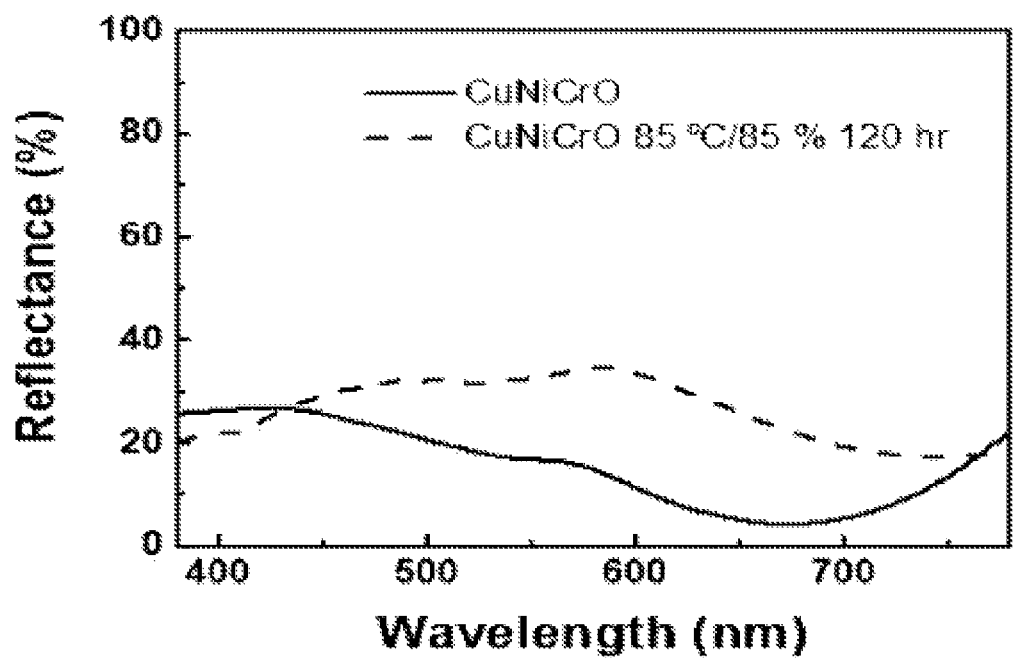
FIG. 8 illustrates a change in light reflectance of a conductive structure according to Comparative Example 2 before and after a constant temperature-humidity test according to Experimental Example 1.

FIG. 8 illustrates a change in light reflectance of the conductive structure according to Comparative Example 2 before and after the constant temperature-humidity test according to Experimental Example 1. Particularly, as a result of the constant temperature and humidity test of the conductive structure according to Comparative Example 2, a change amount of an average light reflectance of a surface of the light reflection reducing layer was 10.7%. In this case, light reflectance of the conductive structure according to Comparative Example 2 is considerably increased from 15.7% to 26.4% in comparison with the light reflectance before the test, so that it was confirmed that visibility is degraded.

According to the results of FIGS. 6 to 8, the conductive structure according to Example 2 has little change in light reflectance even after the constant temperature-humidity test, but it can be seen that the conductive structures according to Comparative Examples 1 and 2 have a large change in light reflectance.

Accordingly, a property of the light reflection reducing layer of the conductive structure according to the exemplary embodiment of the present specification is not changed much even after the constant temperature-humidity test, and the light reflection reducing layer may smoothly perform the function as the light reflection reducing layer.

The invention claimed is:

1. A conductive structure, comprising:
    a substrate;
    a metal layer provided on the substrate; and
    a light reflection reducing layer provided on at least one surface of the metal layer,
    wherein the light reflection reducing layer consists of a four component system of Zn, Cu, Al and O, where
    a content of Zn is 20 at % or more and 30 at % or less,
    a content of Cu is 1 at % or more and 10 at % or less,
    a content of Al is 30 at % or more and 40 at % or less, and
    a content of O is 35 at % or more and 45 at % or less.

2. The conductive structure of claim 1, wherein a thickness of the light reflection reducing layer is 10 nm or more and 100 nm or less.

3. The conductive structure of claim 1, wherein with light at a wavelength of 380 nm to 780 nm, an average light reflectance of a surface of the light reflection reducing layer is 25% or less.

4. The conductive structure of claim 1, wherein the metal layer and the light reflection reducing layer include a metal pattern layer including a plurality of openings and a light reflection reducing pattern layer including a plurality of openings, respectively.

5. The conductive structure of claim 4, wherein each of line widths of the metal pattern layer and the light reflection reducing pattern layer is 0.1 μm or more and 100 μm or less.

6. The conductive structure of claim 4, wherein a line gap between adjacent pattern lines of the metal pattern layer and the light reflection reducing pattern layer is 0.1 μm or more and 100 μm or less.

7. An electrode comprising the conductive structure of claim 1.

8. The electrode of claim 7, wherein the electrode is an electrode for a touch panel, an electrode for a liquid crystal display, or an electrode for an organic light emitting diode (OLED) display.

9. A method of manufacturing a conductive structure, the method comprising:
preparing a substrate;
forming a metal layer on the substrate; and
forming a light reflection reducing layer on the metal layer,
wherein the light reflection reducing layer consists of a four component system of Zn, Cu, Al and O, where
a content of Zn is 20 at % or more and 30 at % or less,
a content of Cu is 1 at % or more and 10 at % or less,
a content of Al is 30 at % or more and 40 at % or less, and
a content of O is 35 at % or more and 45 at % or less.

10. The method of claim 9, wherein the forming of the light reflection reducing layer uses a sputter method using one or more kinds among a metal selected from Zn, Cu, and Al and an oxide of one or two or more selected from among Zn, Cu, and Al as a sputtering target.

11. The method of claim 10, wherein the oxide of the metal is a material in which heterogeneous metals are doped.

12. The method of claim 10, wherein the sputtering target includes one or more kinds of metal selected from Zn, Cu, and Al, and one or more kinds selected from the group consisting of ZnO, AZO, $Al_2O_3$, $Cu_2O$, and CuO.

13. The method of claim 9, further comprising:
forming a metal pattern layer and a light reflection reducing pattern layer by patterning the metal layer and the light reflection reducing layer.

\* \* \* \* \*